(12) United States Patent
Kim et al.

(10) Patent No.: US 7,910,948 B2
(45) Date of Patent: Mar. 22, 2011

(54) LIGHT EMITTING DIODE PACKAGE

(75) Inventors: Sun-Hong Kim, Incheon (KR);
Jin-Won Lee, Yongin-si (KR);
Kyoung-Il Park, Osan-si (KR)

(73) Assignee: Alti-Electronics Co., Ltd. (KR)

( * ) Notice: Subject to any disclaimer, the term of this patent is extended or adjusted under 35 U.S.C. 154(b) by 0 days.

(21) Appl. No.: 12/483,560

(22) Filed: Jun. 12, 2009

(65) Prior Publication Data

US 2009/0309122 A1 Dec. 17, 2009

(30) Foreign Application Priority Data

Jun. 12, 2008 (KR) .................. 10-2008-0055242

(51) Int. Cl.
*H01L 23/495* (2006.01)
(52) U.S. Cl. .................................. 257/99; 257/100

(58) Field of Classification Search ............. 257/98–100
See application file for complete search history.

(56) References Cited

U.S. PATENT DOCUMENTS

2006/0284209 A1* 12/2006 Kim et al. .......... 257/100
2007/0164408 A1* 7/2007 Yeh et al. .......... 257/676

* cited by examiner

*Primary Examiner* — Wai-Sing Louie
*Assistant Examiner* — Bilkis Jahan
(74) *Attorney, Agent, or Firm* — The Farrell Law Firm, P.C.

(57) ABSTRACT

A light emitting diode package is provided including: a lead frame that includes an electrode pad and an electrode lead that are integrally formed to each other; and a housing, wherein the electrode pad is exposed in a first direction through a window formed by inner walls of the housing, and the electrode lead is exposed in a second direction through a throughhole, wherein the housing includes a step jaw prepared by sinking the housing inner walls.

4 Claims, 3 Drawing Sheets

LIGHT EMITTING DIODE PACKAGE

PRIORITY

This application claims priority from and the benefit of Korean Patent Application No. 10-2008-0055242, filed on Jun. 12, 2008, which is hereby incorporated by reference for all purposes as if fully set forth herein.

BACKGROUND OF THE INVENTION

1. Field of the Invention

Disclosed exemplary embodiment is directed to a semiconductor device, and more specifically to a light emitting diode ("LED") package.

2. Description of the Related Art

In general, light emitting diodes ("LEDs") are electrical components that emit light when carriers (electrons or holes) injected into a P-N junction structure of a semiconductor are recombined.

When a forward voltage is applied across the semiconductor of P-N junction structure, electrons and holes move beyond the junction surface to be recombined to each other. As a consequence, energy becomes lower than when the electrons and holes are existent independently from each other, and light is emitted as much as the energy gap. LEDs may emit high efficiency light with a low voltage and therefore the LEDs are recently used for electric appliances, remote controllers, electrical signage, displaying devices, various automatic appliances, etc.

In the meanwhile, the LEDs are manufactured as surface mount device ("SMD") types of LED packages according to devices for information telecommunications being slimmer or smaller. The SMD-type LED packages may be classified into top view types and side view types depending on their use. The side view-type LED packages have been mainly used for backlight units for liquid crystal displays that are employed in cell phones.

The conventional side view-type LED packages have been produced by injection molding. A side view-type LED package includes slopped surfaces, including an upper surface, a lower surface, a left surface, and a right surface, to allow a housing to be easily released from the mold after the injection molding. These slopped surfaces may cause the LED package to be tilted when the LED package is mounted on a printed circuit board ("PCB"). Furthermore, mold resin may overflow the window which exposes the LED chip and spread to other portions when being filled in the window.

Therefore, there is a need of providing an LED package that includes a horizontal support portion on the bottom surface of the housing, which prevents tilting of the LED package due to the slopped surfaces.

In addition, there is a need of providing an LED package that includes a single step indentation at a corner of the housing along the edge of the window so that the mold resin does not overflow the window when being filled in the window.

SUMMARY OF THE INVENTION

According to an exemplary embodiment, there is provided a light emitting diode package including: a lead frame that includes an electrode pad and an electrode lead that are integrally formed to each other; and a housing, wherein the electrode pad is exposed in a first direction through a window formed by inner walls of the housing, and the electrode lead is exposed in a second direction through a through-hole, wherein the housing includes a single step indentation at a corner of the housing along the edge of the window.

The electrode lead may be bent near the through-hole in the first direction, and then bent in the opposite direction of the second direction, and an end of the electrode lead may be extended in the opposite direction of the first direction.

The housing may include an inclined surface which allows a clearance to be provided when the electrode lead is bent in the first direction.

The housing may include a receiving space that receives the end of the electrode lead when the electrode lead is bent in the opposite direction of the second direction.

The housing may include a plurality of slopped surfaces that are slopped from the lead frame in the opposite direction of the first direction, wherein the slopped surface provided near the bottom surface of the housing includes a horizontal support surface that is parallel to the end of the electrode lead.

The lead frame may include first and second lead frames, and a light emitting diode is mounted on an electrode pad of one of the first and second lead frames.

As described above, the LED package according to the exemplary embodiment has a horizontal support portion on the bottom surface of the housing, such that tilting of the LED package due to the slopped surfaces may be prevented when the LED package is mounted on the PCB nonetheless the existence of the slopped surfaces which helps the housing is easily released from the mold.

And, the LED package according to the exemplary embodiment has the single step indentation at the corner of the housing along the circumference of the window, such that the mold resin may be prevented from overflowing the window when being filled in, thus allowing the amount of the resin to be uniform upon.

BRIEF DESCRIPTION OF THE DRAWINGS

The above and other features of the present disclosure will be described in reference to certain exemplary embodiments thereof with reference to the attached drawings in which.

DETAILED DESCRIPTION OF PREFERRED EMBODIMENTS

Figure 1:
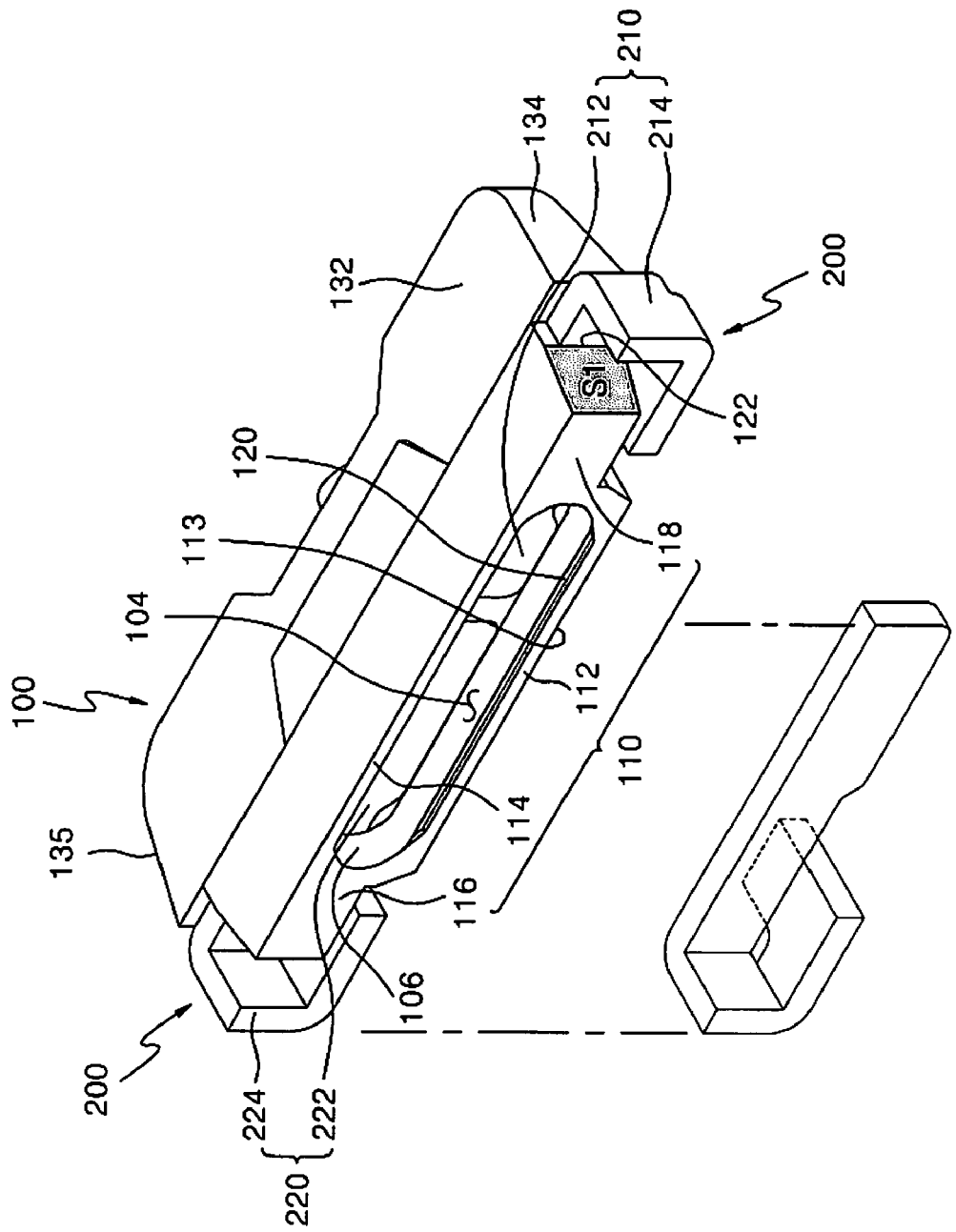
FIG. 1 is a perspective view illustrating a light emitting diode package according to an exemplary embodiment.

Reference will now be made in detail to exemplary embodiments, examples of which are illustrated in the accompanying drawings, wherein like reference numerals refer to the like elements throughout. The embodiments are described below in order to explain the present disclosure by referring to the figures.

FIG. 1 is a perspective view illustrating an LED package according to an exemplary embodiment. Referring to FIG. 1, the LED package according to the exemplary embodiment includes a housing 100 and a lead frame 200.

The housing 100 includes a window 104 exposing electrode pads 212 and 222 and through-holes 122 exposing electrode leads 214 and 224 to the exterior. The window 104 may be formed by a housing wall 110 that is composed of upper and lower wall 114 and 112 and left and right wall 116 and 118. The through-hole 122 may be located at a side surface of the housing 100. The housing 100 may be produced by injection-molding plastics.

The window 104 may by symmetrically formed with respect to each of the vertical axis and horizontal axis. The outer surface of the lower wall 112, which is a lower part of the housing 100 with respect of the horizontal axis, configures a horizontal support surface 113. The horizontal support surface 113 supports the LED package such that it is capable of being mounted on a PCB while maintaining a horizontal orientation.

The housing 100 has a single step indentation 120 at a lower corner of the housing 100 along the edge of the window 104 in the direction of electrode pads 212 and 222. For example, housing 100 has a single step indentation 120 prepared by indenting the corner of the inner wall 106 of the lower wall 112 of the housing 100. The single step indentation 120 prevents the mold resin from overflowing the window 104 when the mold resin is filled in the window 104, such that the amount of the resin may be uniformly adjusted upon a work of filling the mold resin in the window 104. Even though this exemplary embodiment was described such that the single step indentation 120 is provided on the inner wall 106 of the lower wall 112 in the housing wall 110, the exemplary embodiment is not limited thereto. For example, the single step indentation 120 may be provided on other walls in the housing wall 110, such as the inner wall 106 of one or more of the upper wall 114, the left wall 116, and the right wall 118.

The inner wall 106 of the housing wall 110 may be inclined at a predetermined angle. This structure causes the window 104 to be shaped as a trumpet, such that the window 104 has a gradually increasing width and length as going toward its front side. This trumpet-shaped structure may increase the optical efficiency.

The left and right side walls 116 and 118, which are symmetric with respect to the vertical axis, are cut off at their outer corners, thus the front portion of the lateral sides forms inwardly-inclined surfaces S1. The inwardly-inclined surface S1 provides a clearance for the electrode lead 214 and 224, which passes through the through-hole 122 and is bent in the front direction, and this may provide a good bending characteristic to the electrode lead 214 and 224.

In the meanwhile, the housing 100 is formed to be slopped rearwards with respect to the electrode pads 212 and 222. Reference numerals 132, 134, and 135 represent the surfaces slopped rearwards. This slopped structure of the housing 100 allows the housing 100 to be easily released from the injection mold after being injection-molded.

The lead frame 200 includes a first lead frame 210 and a second lead frame 220. The first lead frame 210 includes a conductive, metal-based electrode pad 212 and an electrode lead 214 that are integrally formed with each other and the lead frame 220 includes a conductive, metal-based electrode pad 222 and an electrode lead 224 that are integrally formed with each other. The conductive metal may be copper coated with silver. The electrode pads 212 and 222 are arranged to be insulated from each other in the housing 100, and exposed through the window 104.

An LED chip (not shown) may be mounted on the electrode pad 222 of the second lead frame 220. The electrode pad 222 of the second lead frame 220 is electrically connected to the LED chip directly or via a bonding wire. The electrode pad 212 of the first lead frame 210 may be electrically connected to the LED chip via a bonding wire.

The electrode leads 214 and 224 are externally exposed through the through-hole 122. The electrode leads 214 and 224 are electrically connected to electrode terminals of the PCB (not shown) when the LED package is mounted on the PCB (not shown). The electrode leads 214 and 224 externally exposed may be bent in a predetermined direction to have a predetermined shape.

This will be described in further detail with respect to the second lead frame represented in a disassembled state outside the housing 100, as shown in FIG. 1. The electrode lead 224 is extended through the through-hole 122 located at a lateral side of the housing 100, and bent near the through-hole 122 in the front direction, then bent in the laterally-inward direction beneath the housing 100, then the end of the electrode lead 224 extends in the rearward direction.

Figure 2:
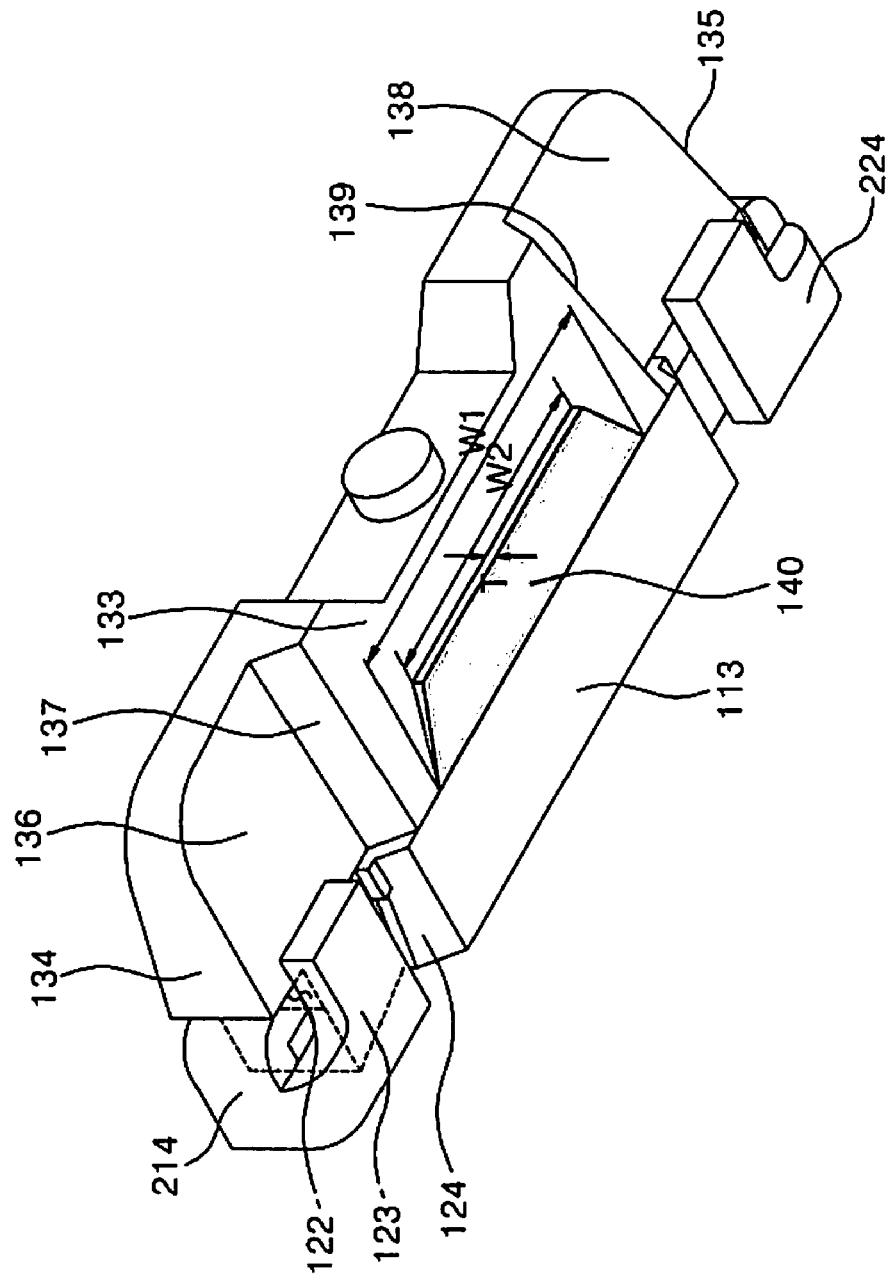
FIG. 2 is another perspective view of the light emitting diode package shown in FIG. 1.

FIG. 2 is another perspective view of the LED package shown in FIG. 1. Referring to FIG. 2, receiving spaces are provided at the bottom surface of the housing 100 in the LED package, which are formed by indenting the bottom surface of both ends of the housing 100. Surfaces represented by reference numerals 123, 124, 136, and 137 form the receiving spaces in the housing 100. The receiving spaces receive the electrode leads 214 and 224 that are exposed through the through-hole 122 and bent. The bottom surface of the electrode leads 214 and 224 received in the receiving space may be coplanar with the horizontal support surface 113.

In the meanwhile, the outer surface of the housing 100 is configured to be slopped rearwards with respect to the electrode pads 212 and 222. Reference numerals 133, 134, 135, 136, 137, 138, and 139 refer to the surfaces slopped rearwards. It can be seen from the slopped surfaces of the housing 100 illustrated in FIG. 1 that the housing 100 is slopingly formed to be symmetric with respect to the upper and lower axis and left and right axis. This slopped structure allows the housing 100 to be easily released from the injection mold after being injection-molded.

In the meanwhile, the housing 100 according to the exemplary embodiment has a horizontal support portion 140 on its bottom surface, which is parallel with the horizontal support surface 113. The horizontal support portion 140 provided near the slopped surface 113 has a thickness T which increases as the horizontal support portion 140 goes rearwards. Moreover, the horizontal support portion 140 has a width which decreases as the horizontal support portion 140 goes rearwards (W2<W1).

Figure 3:
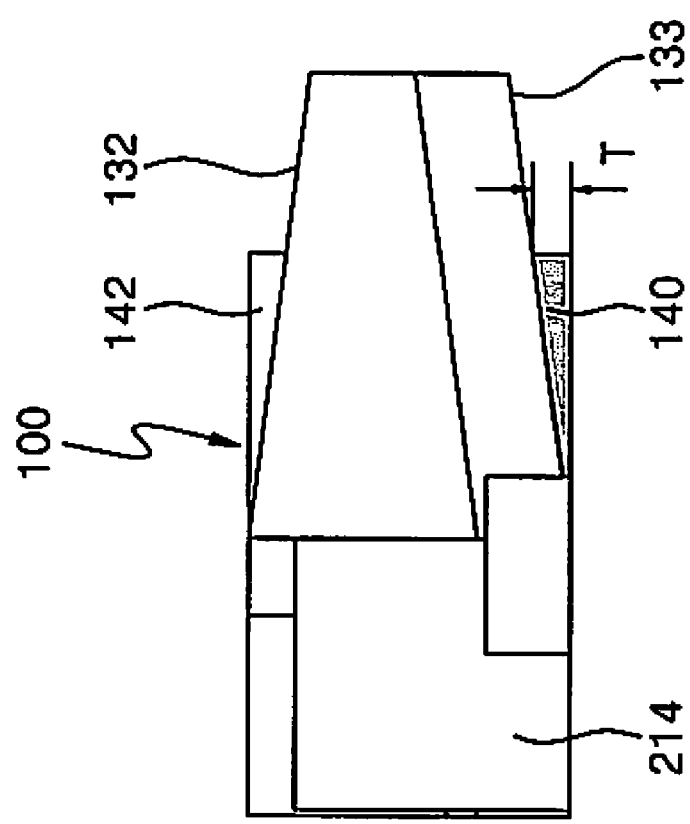
FIG. 3 is a side view of the light emitting diode package shown in FIG. 1.

The conventional LED package has a problem of being tilted due to the slopped surface 133 provided at the bottom surface of the housing when being mounted on the PCB. However, such a problem may be solved in the exemplary embodiment since the horizontal support portion 140 is horizontally extended from the horizontal support surface 113 and formed on the slopped surface 133 to be able to horizontally support the LED package. FIG. 3 is a side view of the LED package shown in FIG. 1, and it can be seen in FIG. 3 that the horizontal support portion 140 may prevent a rearward tilting of the LED package due to the slopped surface 133.

Reference numeral "214" refers to the electrode lead, reference numeral "142" to a portion formed at the top surface of the housing 100 correspondingly to the horizontal support portion 140, and reference numeral 132 to the slopped surface formed at the top surface of the housing 100 correspondingly to the slopped surface 133.

Although the present disclosure has been described with reference to certain exemplary embodiments thereof, it will be understood by those skilled in the art that a variety of modifications and variations may be made to the present disclosure without departing from the spirit or scope of the present disclosure defined in the appended claims, and their equivalents.

What is claimed is:

1. A light emitting diode package comprising:
a lead frame that includes an electrode pad and an electrode lead; and
a housing, wherein
the electrode pad is exposed in a forward direction through a window formed by inner walls of the housing, and the electrode lead is exposed in a laterally-outward direction through a through-hole,
wherein the housing includes a single step indentation at a corner of the housing along the edge of the window,
wherein the electrode lead is bent near the through-hole in the forward direction, and then bent in a laterally-inward direction, and an end of the electrode lead extends in a rearward direction such that a bottom surfaces of the electrode lead is coplanar with a horizontal support surface of a lower part of the housing, and
wherein a front portion of lateral sides of the housing includes a forwardly-inclined surface, which allows a clearance for the electrode lead bent in the forward direction.

2. The light emitting diode package of claim 1, wherein the housing includes a receiving space that receives the end of the electrode lead when the electrode lead is bent in laterally-inward direction.

3. The light emitting diode package of claim 1, wherein the housing includes a plurality of slopped surfaces that are sloped from the lead frame in the rearward direction.

4. The light emitting diode package of claim 1, wherein the lead frame includes first and second lead frames, and a light emitting diode is mounted on an electrode pad of one of the first and second lead frames.

* * * * *